US006486538B1

United States Patent
Reiss et al.

(10) Patent No.: US 6,486,538 B1
(45) Date of Patent: Nov. 26, 2002

(54) CHIP CARRIER HAVING VENTILATION CHANNELS

(75) Inventors: Martin Reiss, Regensburg (DE); Johann Winderl, Wackersdorf (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/580,984

(22) Filed: May 30, 2000

(30) Foreign Application Priority Data

May 27, 1999 (DE) .......................... 199 24 307
May 9, 2000 (DE) .......................... 100 22 482

(51) Int. Cl.⁷ ............................. H01L 23/495
(52) U.S. Cl. ................. 257/668; 257/680; 257/723; 257/724; 257/731; 257/784
(58) Field of Search ................. 257/723, 724, 257/731, 680, 784, 668

(56) References Cited

U.S. PATENT DOCUMENTS

| 5,708,294 A | 1/1998 | Toriyama |
| 5,710,071 A | 1/1998 | Beddingfield et al. |
| 5,767,571 A | * 6/1998 | Kimura et al. ............. 257/668 |
| 5,777,391 A | * 7/1998 | Nakamura et al. ......... 257/778 |
| 5,818,698 A | * 10/1998 | Corisis ..................... 361/760 |

FOREIGN PATENT DOCUMENTS

DE    196 00 393 A1    8/1996

OTHER PUBLICATIONS

Japanese Patent Abstract No. 6–69401 (Maruyama), dated Mar. 11, 1994.
Japanese Patent Abstract No. 08046117 A (Hiroshi et al.), dated Feb. 16, 1996.

* cited by examiner

Primary Examiner—Kamand Cuneo
Assistant Examiner—Luan Thai
(74) Attorney, Agent, or Firm—Laurence A. Greenberg; Werner H. Stemer; Ralph E. Locher

(57) ABSTRACT

A chip carrier made of a non-metallic material has conductor tracks applied thereon for producing an external, two-dimensional connection configuration for electronic circuit chips. The chip carrier has a multiplicity of chip mounting locations and first cutouts disposed in such a way that at least one first cutout is adjacent each of the chip mounting locations. A second, channel-like cutout in the chip carrier leads from each chip mounting location to a first cutout adjacent the chip mounting location.

4 Claims, 1 Drawing Sheet

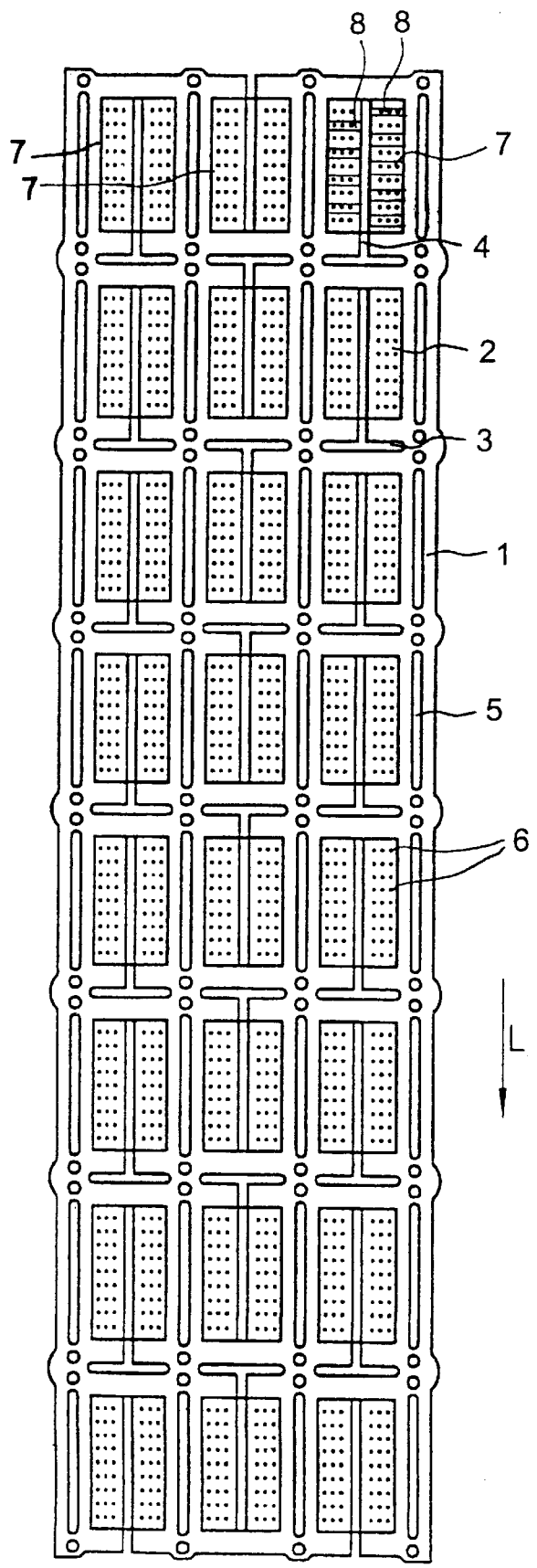

CHIP CARRIER HAVING VENTILATION CHANNELS

BACKGROUND OF THE INVENTION

Field of the Invention

The present invention relates to a chip carrier made of a non-metallic material, including conductor tracks applied thereon for producing an external, two-dimensional connection configuration for electronic circuit chips, a multiplicity of chip mounting locations, and cutouts each disposed in such a way that at least one of the cutouts is adjacent each of the chip mounting locations.

Semiconductor components which are provided with a chip carrier of the type mentioned above are applied to a carrier, e.g. a printed circuit board, for example through the use of a ball grid array (BGA) and are electrically connected to that carrier. The finished semiconductor component is thus a so-called "Chip Size Package". The chip carrier is typical of semiconductor components of that type and the chip carrier serves the function of rewiring. To that end, the chip carrier has conductor tracks on a non-metallic layer on a side remote from the circuit chip. The conductor tracks end in the vicinity of a so-called "bond window" of the chip carrier. The "bond window" is also referred to as a bonding channel.

The bonding channel in the chip carrier enables an electrical connection of conductor track ends through a bonding wire or through direct contact-connection of the conductor track ends to contact pads of the circuit chip which are situated in the bonding channel. A further, non-metallic layer, e.g. a soldering resist mask, is usually applied on the conductor tracks, which omits the other ends of the conductor tracks. A soldering contact is electrically conductively connected to those exposed ends of the conductor tracks. The soldering contact may be constructed as a ball, for example. That results in a two-dimensional connection configuration which utilizes the area of the semiconductor chip.

In order to avoid damage to the electrical connection due to mechanical influences or the ingress of moisture, provision is made for encapsulating the circuit chip and chip carrier after the electrical connection has been established between the circuit chip and the conductor tracks.

For that purpose, a plurality of electronic circuit chips are mounted on the chip carriers mentioned above, or on the chip mounting locations provided for them, and are subsequently encapsulated by an encapsulation compound in order to form a chip housing. The encapsulation is effected by the application of an initially liquid encapsulation compound which solidifies and forms the housing.

On one hand, the introduction of the encapsulation compound necessitates providing the chip carrier with a plurality of spacers in each case at positions of the mounting locations, with the circuit chips being placed onto those spacers. On the other hand, an adhesive whole-area film, for example, is applied on that side of the chip carrier which is remote from the circuit chip. The spacers result in a small clearance being produced between the circuit chip and the chip carrier, through which the encapsulation compound can penetrate in the direction of the bonding channel. The aim, in particular, is for the bonding channel, which includes the electrical contacts, to be completely filled with the encapsulation compound. The adhesive, whole-area film prevents the encapsulation compound from escaping on that side of the chip carrier which is remote from the circuit chip.

The problem which arises in that case is that gases may be included in the housing, in particular in the bonding channel, and bubbles or cavities may thus form in the housing, which can adversely affect the reliability and the stability of the housing. The influence of bubbles and thus moisture can result in delamination of the semiconductor component.

Ventilation channels in chip carriers are known in the prior art, from U.S. Pat. No. 5,708,294 and from U.S. Pat. No. 5,710,071. The ventilation channels serve to provide better ventilation during the encapsulation of the circuit chip. However, what is problematic about the teaching according to the prior art, is that either the chip carrier loses some of its stability due to a multiplicity of ventilation channels or relatively complicated methods are necessary for producing a chip carrier having ventilation channels.

SUMMARY OF THE INVENTION

It is accordingly an object of the invention to provide a carrier for electronic circuit chips having ventilation channels, which overcomes the hereinafore-mentioned disadvantages of the heretofore-known devices of this general type and which allows ventilation during an encapsulation of circuit chips in a simplified manner.

With the foregoing and other objects in view there is provided, in accordance with the invention, a non-metallic chip carrier, comprising conductor tracks for producing an external two-dimensional connection configuration for electronic circuit chips; a multiplicity of chip mounting locations; first cutouts, at least one of the first cutouts disposed adjacent each respective one of the chip mounting locations; and second, channel-like cutouts each leading from a respective one of the chip mounting locations to a respective one of the first cutouts adjacent the chip mounting location.

In this case, by way of example, the first cutouts may be constructed as holes or load-relieving slots in the chip carrier. By virtue of the second cutouts extending from the chip mounting location toward the first cutouts, the shortest possible path is provided for conducting gases away from the region of the chip mounting location. The bonding channel ("bond window") is advantageously used as the second cutout. In this way, the stability of the chip carrier is only weakened to an insignificant extent in comparison with the prior art structure. This considerably increases the efficacy of the ventilation channel.

In accordance with another feature of the invention, the chip mounting locations are disposed in at least two rows extending in a longitudinal direction on the chip carrier. In this case, first cutouts are at least provided between two chip mounting locations in each case in the longitudinal direction. As an alternative, however, first cutouts may also be formed between all of the chip mounting locations.

In accordance with a concomitant feature of the invention, the second, channel-like cutouts preferably extend in the longitudinal direction proceeding from the chip mounting locations toward the first cutouts, which are each disposed between two chip mounting locations in the longitudinal direction. In this case, within a row in the longitudinal direction, the orientation of the second cutouts, as viewed in a manner proceeding from the respective chip mounting location, may be chosen to be identical, that is to say each of the first cutouts may be disposed either "upstream" or "downstream" proceeding from a chip mounting location within a row. However, the orientation of the second cutouts of the directly adjacent rows is chosen to be opposed to the orientation of the second cutouts within the row under consideration. Consequently, if all of the second cutouts within one row are disposed downstream, then the second cutouts in the directly adjacent row or rows are disposed upstream proceeding from the chip mounting location. The effect achieved by such an alternating configuration of the second cutouts is that the stability of the chip carrier is impaired as little as possible.

Other features which are considered as characteristic for the invention are set forth in the appended claims.

Although the invention is illustrated and described herein as embodied in a chip carrier having ventilation channels, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a diagrammatic, plan view of a chip carrier having a plurality of rows of chip mounting locations and alternately provided ventilation channels.

DESCRIPTION OF THE PREFERRED EMBODIMENTS

Referring now in detail to the single FIGURE of the drawing, there is seen a chip carrier 1 which has three rows of chip mounting locations 2. However, it is also possible to provide as many rows of chip mounting locations 2 as desired on such a chip carrier 1. The rows of chip mounting locations 2 extend in a longitudinal direction L in each case. First cutouts 3 are disposed at least between individual chip mounting locations 2 in the longitudinal direction. In the case of the present example illustrated in the FIGURE, the first cutouts 3 serve as load-relief slots and are each oriented perpendicularly to the longitudinal direction L. In addition, further cutouts 5 may also be provided perpendicularly to the longitudinal direction L. The further cutouts 5 are adjacent the chip mounting locations 2 and are oriented parallel to the longitudinal direction L. Reference numeral 6 designates spacers on which circuit chips are placed.

A ventilation channel is provided as a second cutout 4 for each of the chip mounting locations 2. The second cutout 4 extends from the respective chip mounting location 2 to an adjacent first cutout 3 and thereby merges with that first cutout 3.

In this case, the second cutouts 4 constitute bonding channels in which, prior to encapsulation, an electrical connection is established between the circuit chips 7 having borders which are congruent with the chip mounting locations 2 and conductor tracks 8 of the chip carrier which have been illustrated for completeness but are actually on the opposite side of the chip carrier 1. In this case, within a row of chip mounting locations 2, the ventilation channels 4, as viewed from the respective chip mounting location 2, each have the same orientation with respect to the longitudinal direction L. In other words, within a row of chip mounting locations 2, all of the ventilation channels 4 are disposed either "upstream" or "downstream" proceeding from the respective chip mounting location 2. In contrast, the ventilation channels 4 of two adjacent rows have mutually opposed orientations. Thus, in the illustrated example according to the figure, the respective outer rows have a downstream-directed orientation of the ventilation channels 4, whereas the middle row has an upstream-directed orientation of the ventilation channels 4.

If the ventilation channels 4 are considered perpendicularly to the longitudinal direction L, then they have an alternating orientation. By virtue of this alternating configuration of the ventilation channels 4, an adverse effect on the stability of the chip carrier due to the additional cutouts 4 is reduced to a minimum. Consequently, there is a considerable improvement in the ventilation during the encapsulation operation that is subsequently to be performed, without a significant loss in the stability of the chip carrier. Moreover, the ventilation channels 4 can be produced in a simple manner during an impressing operation and at the same time as the rest of the cutouts 3, 5 are produced.

We claim:

1. A non-metallic chip carrier, comprising:
   a multiplicity of chip mounting locations disposed in at least two rows extending in a longitudinal direction;
   first cutouts, at least one of said first cutouts disposed adjacent each respective one of said chip mounting locations, and said first cutouts disposed as load-relief slots; and
   second cutouts, each leading from a respective one of said chip mounting locations to a respective one of said first cutouts adjacent said chip mounting location, and said second cutouts disposed as ventilation channels, and said first cutouts being each disposed between two respective chip mounting locations in the longitudinal direction.

2. The chip carrier according to claim 1, including conductor tracks for producing an external two-dimensional connection configuration for electronic circuit chips.

3. The chip carrier according to claim 2, wherein said second, channel-like cutouts are bonding channels into which the conductor tracks protrude.

4. The chip carrier according to claim 1, wherein:
   said second, channel-like cutouts extend in the longitudinal direction from said chip mounting locations toward said first cutouts; and
   said second cutouts, as viewed from a respective one of said chip mounting locations, each have the same orientation relative to the longitudinal direction within a row, but a mutually opposed orientation in two adjacent rows.

* * * * *